United States Patent [19]
Schreffler

[11] Patent Number: 6,011,691
[45] Date of Patent: Jan. 4, 2000

[54] ELECTRONIC COMPONENT ASSEMBLY AND METHOD FOR LOW COST EMI AND CAPACITIVE COUPLING ELIMINATION

[75] Inventor: Gary J. Schreffler, Winter Park, Fla.

[73] Assignee: Lockheed martin Corporation, Bethesda, Md.

[21] Appl. No.: 09/064,735

[22] Filed: Apr. 23, 1998

[51] Int. Cl.[7] ...................................................... H05K 7/20
[52] U.S. Cl. .......................... 361/704; 361/792; 361/818; 257/738; 257/780; 174/35 MS; 174/52.4
[58] Field of Search ..................................... 361/704–707, 361/715–725, 688, 816, 813, 815, 806, 820, 684; 257/703, 705, 720, 795, 706, 747, 659, 700, 710, 738, 664; 165/46, 185, 80.3, 80.4; 428/650, 195, 621, 614, 185, 285, 406, 408, 457, 901, 902; 29/25.42, 650, 195, 137, 843; 216/18; 438/119; 228/126; 439/79; 174/52.4, 35 MS, 252, 254, 16.3, 62.8

[56] References Cited

U.S. PATENT DOCUMENTS

| | | | |
|---|---|---|---|
| 4,878,152 | 10/1989 | Sauzade et al. | 361/721 |
| 4,882,454 | 11/1989 | Peterson et al. | 174/68.5 |
| 5,195,021 | 3/1993 | Ozmat et al. | 361/386 |
| 5,251,099 | 10/1993 | Goss et al. | 361/721 |
| 5,347,091 | 9/1994 | Schroeder | 174/262 |
| 5,353,191 | 10/1994 | Volz et al. | 361/690 |
| 5,366,027 | 11/1994 | Turek et al. | 174/261 |
| 5,432,303 | 7/1995 | Turek et al. | 174/259 |
| 5,463,530 | 10/1995 | DeGree | 361/707 |
| 5,495,394 | 2/1996 | Kornfeld et al. | 361/764 |
| 5,510,958 | 4/1996 | Shimabara et al. | 361/719 |
| 5,586,011 | 12/1996 | Alexander | 361/818 |
| 5,639,989 | 6/1997 | Higgins | 174/35 MS |

*Primary Examiner*—Donald Sparks
*Assistant Examiner*—Michael Datskovsky
*Attorney, Agent, or Firm*—Burns, Doane, Swecker & Mathis

[57] ABSTRACT

The present invention is directed to an electronic component assembly which cost effectively eliminates capacitive coupling while providing significant heat transfer. Exemplary embodiments ensure that the circuit ground of electrical circuits on printed wiring boards and the chassis ground remain separate so that undesired ground loops are not created and so that a Faraday shield or "cage" can be established around all circuit elements to reduce EMI effects on the circuit.

17 Claims, 6 Drawing Sheets

ELECTRONIC COMPONENT ASSEMBLY AND METHOD FOR LOW COST EMI AND CAPACITIVE COUPLING ELIMINATION

BACKGROUND OF THE INVENTION

1. Field of the Invention

The present invention generally relates to an electronic component assembly (ECA) and to an associated method for making an electronic component assembly which can be used to eliminate capacitive coupling between multiple closely arranged printed wiring boards.

2. State of the Art

Printed wiring boards (PWBs) are usually arranged in a close or stacked manner in order to minimize their space requirements. These printed wiring boards are normally connected electrically to a chassis. Electrical circuits contained in the printed wiring boards have a common "circuit ground potential" while the chassis includes a separate "chassis ground potential". The chassis ground can provide a Faraday shield which protects the electrical circuits of the printed wiring boards from electromagnetic interference (EMI) of outside sources, such as radar energy.

The separate ground circuits are maintained to avoid electrical problems. For example, if the different ground elements of the circuit and the chassis are brought into contact, a ground loop can form between the printed wiring boards which raises the potential of the circuit ground above zero volts and renders the electrical circuits susceptible to noise. The proper operation of circuits which use discrete logic levels can be affected when noise distorts the circuit ground to a value greater than zero volts.

In an effort to reduce space and costs, it is desirable to place printed wiring boards physically closer to one another while still maintaining the separate grounds. To dissipate heat between plural, closely placed printed wiring boards, heat sinks are located between the printed wiring boards. This configuration can cause a capacitive coupling to occur between the printed wiring boards and the heat sink assembly. Because the speed of circuits has increased while the spacing between printed wiring boards has decreased, the capacitive coupling becomes more damaging to proper circuit operation as the influence of transient signals becomes more pronounced.

Capacitive coupling can be reduced in several different ways. For example, conductors can be placed between two adjacent printed wiring boards to short circuit the capacitive coupling. U.S. Pat. No. 5,251,099 (Goss et al.) discloses the use of connector pins which are attached to each circuit board and which connect with an adjoining circuit board. U.S. Pat. No. 5,353,191 (Volz et al.) discloses connectors mounted within the heat sink and provides a circuit interface between two printed circuit boards.

Capacitive coupling can also be reduced through the use of conductive adhesives. For example, U.S. Pat. No. 5,366,027 (Turek et al.) discloses a conductive tape placed between a heat sink and a dielectric in an attempt to reduce capacitive coupling.

Other attempts to reduce capacitive coupling include forming a separate ground layer on each printed wiring board. However, this technique requires further steps to make the circuit card assemblies thus increasing their cost and assembly time.

The foregoing methods of reducing the capacitive coupling are labor intensive and require a high degree of precision to avoid short circuits. Accordingly, an efficient, cost-effective technique to address the occurrence of capacitive coupling is needed.

SUMMARY OF THE INVENTION

The present invention is directed to an electronic component assembly which can be effectively implemented and which effectively eliminates capacitive coupling while providing significant heat transport. Exemplary embodiments ensure that the circuit ground of electrical circuits on printed wiring boards and a separate chassis ground remain isolated from one another so that undesired ground loops are not created and so that a Faraday shield or "cage" can be established around all circuit elements to reduce EMI on the circuit.

In an exemplary embodiment of the invention, a double sided electronic component assembly includes a heat sink assembly located between two printed wiring boards to provide heat transport. The heat sink assembly efficiently transports heat without inducing a capacitive coupling.

The heat sink assembly can be made with an impregnated graphite material. The graphite material can be plural sheets of impregnated graphite to provide thermally and electrically conductive properties. The composite graphite can be surrounded with a dielectric. The heat sink assembly can then be coated with a foil and plated with a protective conductive plating. As long as there is no contact between the conductive plating and the printed wiring boards or composite graphite material, the different ground potentials will remain separate so that unwanted noise will not hinder system performance. To remove any capacitive coupling between the printed wiring boards, a plated through-hole can be drilled through the printed wiring boards and the heat sink to provide a unitary circuit ground for all of the printed wiring boards.

In accordance with an exemplary embodiment, the ground potential of the chassis and the ground potential of the printed wiring boards can be separated so that a cover can be added to the top and bottom of the electronic component assembly to provide a Faraday shield. The cover can be configured to contact a plated area around the periphery of the electronic component assembly and ensure an outer chassis ground potential and an inner ground potential of the heat sink and printed wiring boards do not come into contact.

BRIEF DESCRIPTION OF THE DRAWINGS

Other objects and advantages of the present invention will become more apparent from the following detailed description of preferred embodiments, when read in conjunction with the accompanying drawings wherein like elements have been represented by like reference numerals and wherein.

DETAILED DESCRIPTION OF THE PREFERRED EMBODIMENTS

Figure 1:
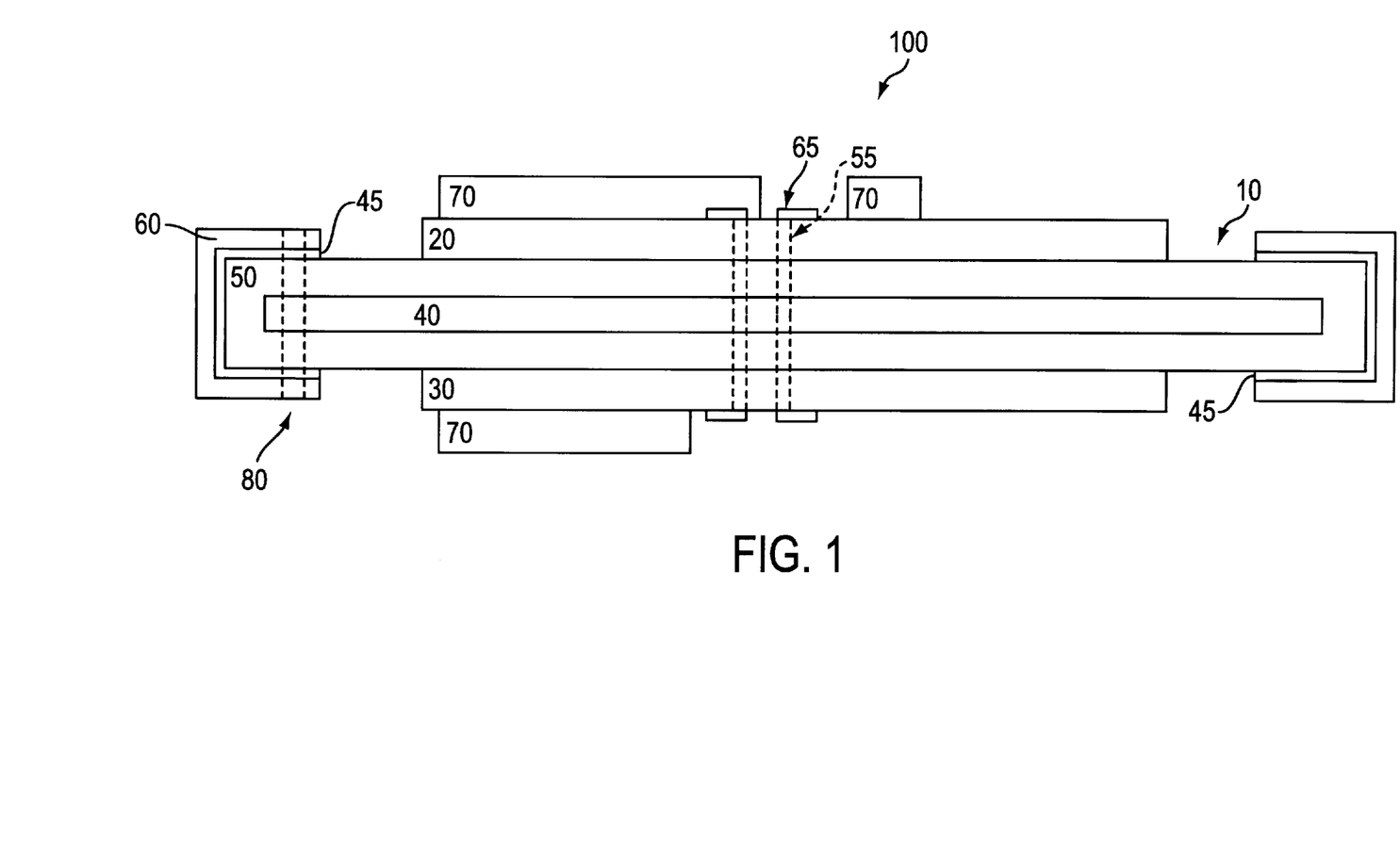
FIG. 1 shows a cross-sectional view of an exemplary embodiment of an electronic component assembly of the present invention, with printed wiring boards being located on both sides of a heat sink assembly.

FIG. 1 shows a cross-sectional view of an electronic component assembly 100, wherein a heat sink assembly 10 is located between two printed wiring boards (PWBs) 20 and 30. One or both of the printed wiring boards 20 or 30 can have one or lmore circuit elements 70 located on each board. At the center of the heat sink assembly 10 is an inner core 40 composed of a graphite material.

The graphite material is chosen based upon several different factors such as thermal conductivity and electrical conductivity. The graphite material of the FIG. 1 exemplary embodiment has sufficient electrical and thermal conductivity to achieve a desired heat sink function, given the heat dissipation of electrical circuits included on the printed wiring boards. Plural sheets of graphite can be combined with a filler resin and pressed to become a laminate. An example of a common graphite laminate is Thermalgraphm™, available from Amoco Corporation. Other types of common graphite fiber and filler resins can also be used as the inner core 40 of the heat sink assembly, as can any other thermally conductive material.

Figure 2:
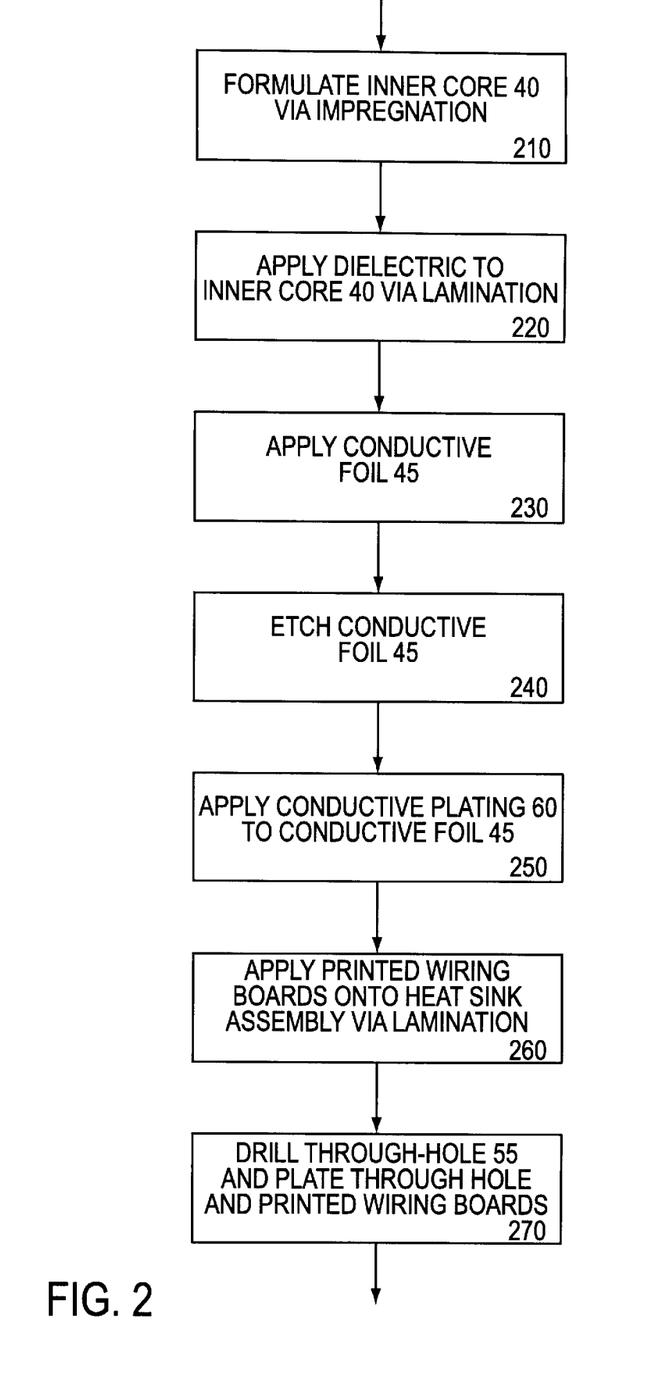
FIG. 2 shows a flow chart of an exemplary process for making an electronic component assembly in accordance with the present invention.

FIG. 2 illustrates a flow chart which depicts an exemplary process by which the electronic component assembly in FIG. 1 can be manufactured. In step 210 of the FIG. 2 process, once a heat sink material and resin have been selected, the inner core 40 of the heat sink assembly is formulated via impregnation. In order to formulate the inner core 40 by impregnation, resin is added to layered graphite cloth. The cloth and resin are then pressed to formulate the inner core 40 of the heat sink assembly. Alternately, a pre-manufactured inner core can be utilized, thus eliminating the impregnation step.

Once the inner core 40 has been made via impregnation or, a pre-manufactured inner core has been obtained, in step 220 the next layer of the heat sink assembly in the exemplary FIG. 1 embodiment is applied as a dielectric layer 50 which surrounds the inner core 40. For example, the dielectric layer 50 can be chosen based upon factors such as electrical conductivity, thermal conductivity and ability of the material to be plated by other conductive materials. In the dielectric material 50 of this exemplary embodiment, a material which is substantially electrically non-conductive, and which has good thermal conductivity can be chosen. The dielectric layer 50 can be a printing wiring board laminate, such as a cyanate ester laminate, an epoxy based laminate, kevlar, polyamide quartz or any other suitable material. In addition to being substantially electrically non-conductive and thermally conductive, it is also advantageous for the dielectric material chosen to be easily plateable with material used for electrically contacting the chassis ground. For example, the dielectric material 50 can be plated with a nickel material over a copper layer (e.g., nickel over copper).

Also, the dielectric material can be selected in accordance with a temperature value, $T_g$, which is the temperature at which the material changes physical properties by becoming soft or liquefing. The dielectric material's $T_g$ value can be selected high enough that the material does not melt or become soft during lamination processing when the electronic component assembly is being formed. For example, where a dielectric material has a relatively low $T_g$ value, higher temperature (i.e., temperatures above the $T_g$ value) cause a change in material property that results in a softening of the dielectric layer 50 or delamination of the dielectric material 50 down to the inner core 40. The dielectric material 50 is applied to the surface of the inner core 40 by, for example, lamination, or any other suitable technique, such as any coating technique. The dielectric material 50 can be applied through a coating technique to avoid bonding materials which are applied through coating are typically lower than dielectric materials that are applied through lamination. Alternately, the dielectric layer can be applied via the impregnation step discussed above. For example, sheets of dielectric material, chosen in accordance with the above-discussed characteristics, can be placed on top of the graphite cloth. Then resin is added and the assembly is pressed. The result is an impregnated inner core 40 and dielectric layer 50.

In step 230, after the dielectric material 50 shown in FIG. 1 has been applied to the inner core 40, by impregnation or lamination, a conductive foil 45 of FIG. 1, such a copper, can be bonded to the dielectric material and subsequently plated with copper to cover the edges and through-holes 80.

Figure 3:
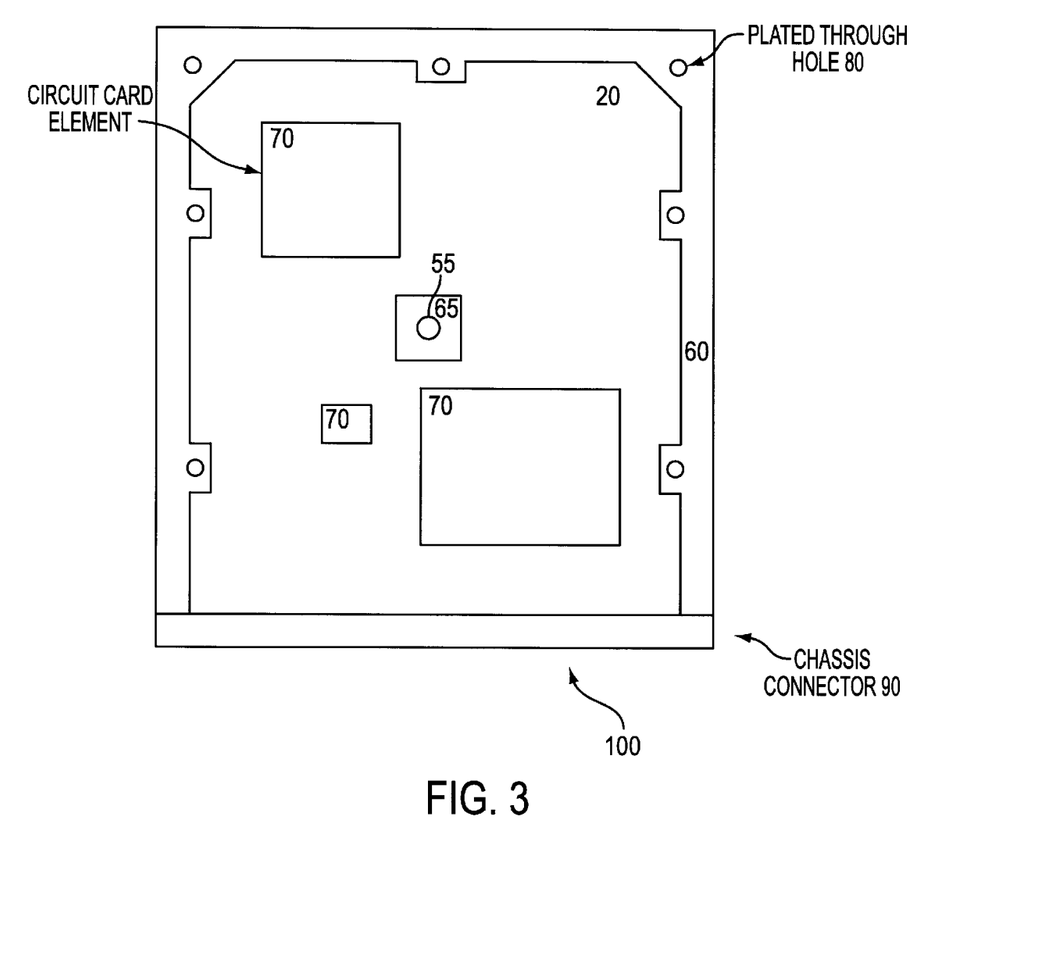
FIG. 3 shows a top view of an exemplary embodiment of an electronic component assembly in accordance with the present invention.

In step 240, portions of the conductive foil 45 can be selectively removed through patterning and etching. For example, photoresist can be deposited over the conductive foil and selectively patterned to remain over areas where the foil is to be retained using known photolithography techniques. The heat sink assembly 10 is irradiated with light and the conductive foil 45 is removed in any areas where the photoresist was not exposed to the light. In an exemplary embodiment, the foil can be retained around the edges and in the holes of the heat sink assembly as shown in FIGS. 1 and 3.

In step 250 of FIG. 2, a layer of conductive material 60 (e.g., nickel, gold) of FIG. 1 is plated onto the heat sink assembly 10 which now includes the patterned foil and plated through-holes 80. This conductive material is used as a chassis ground for the Faraday shield. The type of conductive material 60 is chosen based upon the electrical conductivity, corrosion resistance, durability and the ability to adhere to the foil. The conductive material is placed on top of the patterned foil formed in steps 230 and 240 of FIG. 2. The conductive foil 45 is used because the conductive material 60 will better adhere to conductive foil than it will to the dielectric material of the heat sink assembly.

In step 260 of FIG. 2, the printed wiring boards 20 and 30 are placed onto the heat sink assembly through another lamination process. The conductive material 60 applied in step 250 and the conductive foil 45 applied in step 230, however, are prevented from touching conductive areas of the printed wiring boards or the inner core of the heat sink assembly. Circuit covers 85, as shown in FIG. 4, can be used to make contact with the conductive material 60 and create a shield of chassis ground around the printed wiring boards 20 and 30.

In step 270, to reduce and/or eliminate capacitance coupling within the electrical component assembly 100, one or more through-holes 55 of FIG. 1 are drilled after the printed wiring boards 20 and 30 have been attached to the assembly through lamination. Each hole is drilled from a printed wiring board on one side of assembly 100 to a printed wiring board on another side of the assembly 100. Next, another layer of conductive plating 65 (e.g., copper, nickel, gold, rhodium or other suitable material) is applied to the surface of the printed wiring boards 20 and 30 and through-hole 55 to establish a circuit ground within the electronic component assembly 100. The conductive foil 65 can then be selectively removed for placement of individual components on the printed wiring board in accordance with known methodology. The drilling of a through-hole 55 allows for a circuit to be formed between the center of the heat sink and the two circuit boards eliminating the capacitive coupling between printed wiring boards 20 and 30. Provided there is no connection with the chassis ground, there will be no ground loops and, as a result, the electronic component assembly can efficiently operate.

Figure 4:
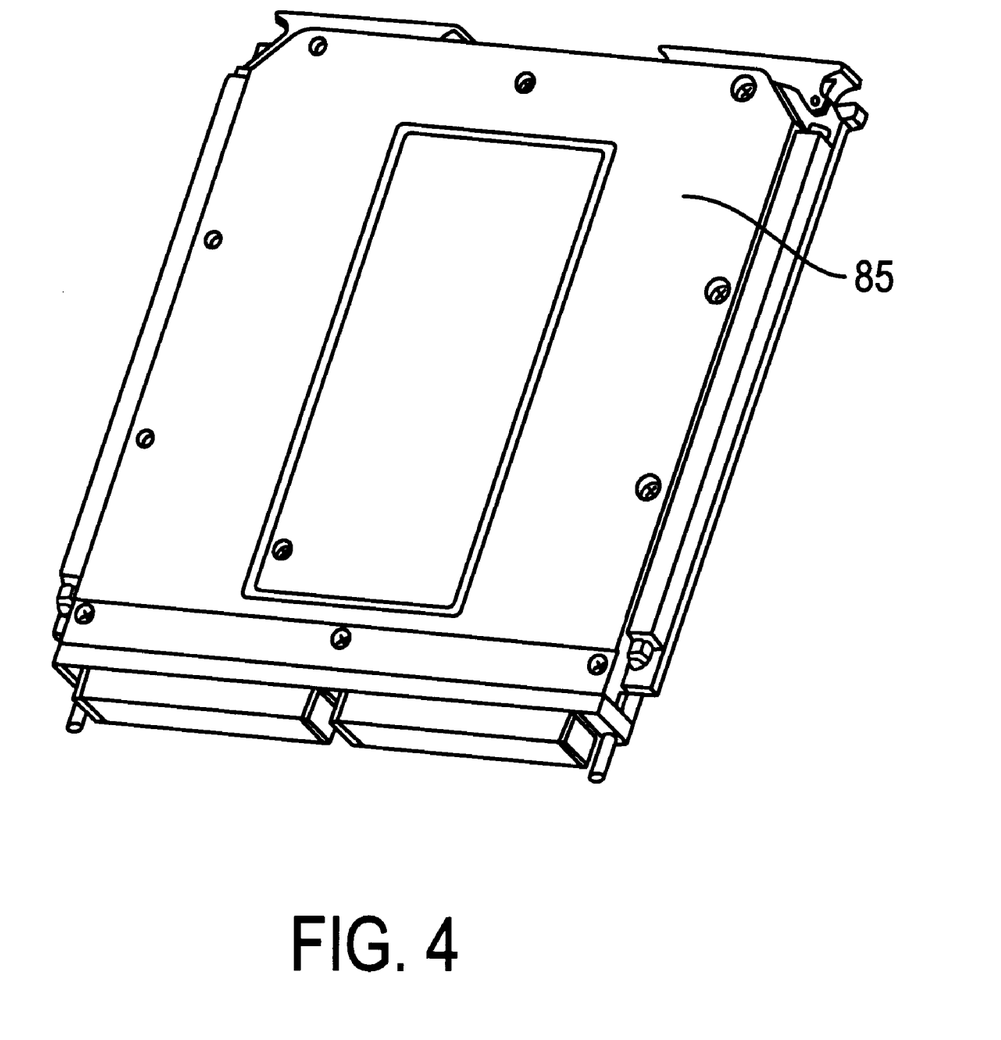
FIG. 4a shows a top view of an electronic component assembly with a cover in accordance with an exemplary embodiment of the present invention.

As shown in FIG. 3, a top view of the electronic component assembly is disclosed without any covers 85 (shown in FIG. 4). Note that, in the FIG. 3 embodiment, the conductive material 60 surrounds the periphery of the electronic component assembly 100. Attached to a lower part of the electric component assembly 100 is a connector 90. The shell of the connector 90 is chassis ground. When the cover is placed over the electronic component assembly to form the Faraday shield, the connector 90 becomes a part of that shield. In the center of the electric component assembly 100 are the circuit elements 70 and plated through-hole(s) 55 of the printed wiring board 20 shown in FIG. 1, which are maintained at circuit ground. The plated through-holes 80 which are located on the periphery of the electric component assembly 100 are used in an exemplary embodiment to attach the cover to the electronic component assembly.

FIG. 4 shows the same electronic component assembly 100 with the cover 85 installed. The cover 85 can be made of a conductive material, such as aluminum with nickel.

The plated through-holes 80, as shown in FIGS. 1 and 3, can be formed on the edge of the electronic component assembly 100, where the conductive material 60 is plated onto the assembly for the purpose of connecting the cover 85. The plated through-holes 80, however, can be treated differently than the plated through-hole 55. Because the plated through-holes 80 contact the conductive material 60, they are at chassis level ground. Accordingly, precautions are taken to prevent the plated through-holes 80 from contacting the circuit ground of the inner core 40 of the heat sink assembly. For example, when the heat sink is being assembled, an area of the inner core 40 of the heat sink 10 can be pre-drilled and filled with a dielectric material. This dielectric material can be chosen in accordance with the factors discussed previously with respect to dielectric layer 50 and, for example, the epoxy or other dielectric material mentioned earlier can be used. The dielectric material provides a layer between the conductive foil material 45 and the inner core 40 which is at circuit ground. Thus, the printed wiring boards 20 and 30 remain at circuit ground while the conductive material 60 remains at chassis ground level.

Figure 5A:
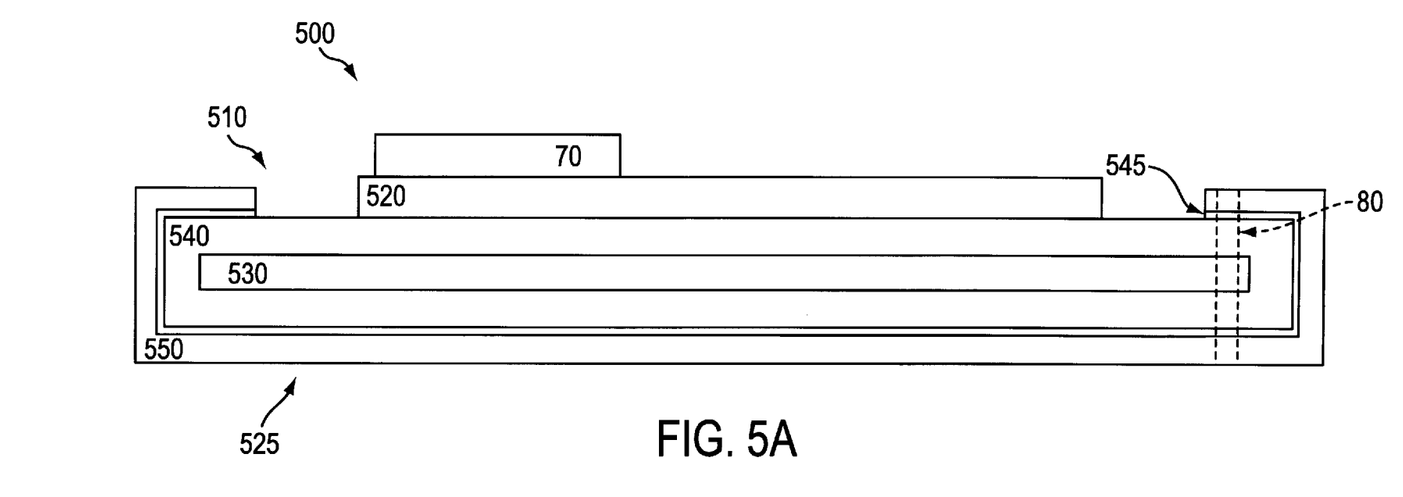
FIG. 5a shows a cross-sectional view of another exemplary electronic component assembly in accordance with the present invention, with a single printed wiring board attached on one side of a heat sink assembly.
Figure 5B:
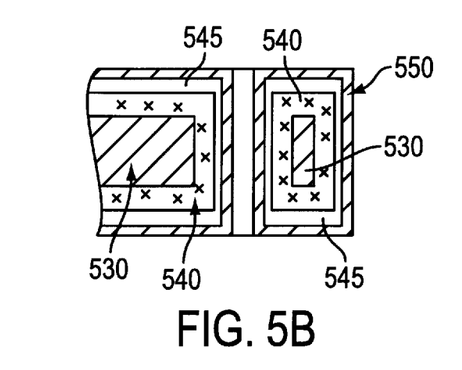
FIG. 5b shows a detailed cross-sectional view of the periphery of an exemplary electronic component assembly in accordance with the present invention.

Another exemplary embodiment of the invention shown in FIG. 5a employs a one sided electronic component assembly or circuit board. The heat sink assembly 510 is assembled much like the FIG. 1 embodiment. However, since there is no printed wiring board on the second side 525 of the heat sink assembly, there is a slight alteration in the manufacture. Once the inner core 530 of the heat sink assembly 510 is formed for example, by impregnation, a dielectric layer 540 can be laminated to the heat sink. The conductive foil 545 and conductive plating 550 are then attached to the dielectric 540, as discussed above with respect to FIG. 1. A detailed cross sectional view of the periphery of the assembly 510, with a through-hole 80, is shown in FIG. 5b. However, because there is only one printed wiring board 520 attached to the heat sink assembly 510, the conductive foil 545 and the conductive plating 550, such as nickel or gold, is applied to the bottom of the assembly. Each material can be selected according to the characteristics discussed with respect to the electronic component assembly shown in FIG. 1. Separation of the circuit ground and chassis ground prevents a ground loop between circuit ground and chassis ground, and for the Faraday shield to be maintained. A cover 85 can also be attached to the conductive material 550 to complete the Faraday shield.

Figure 6:
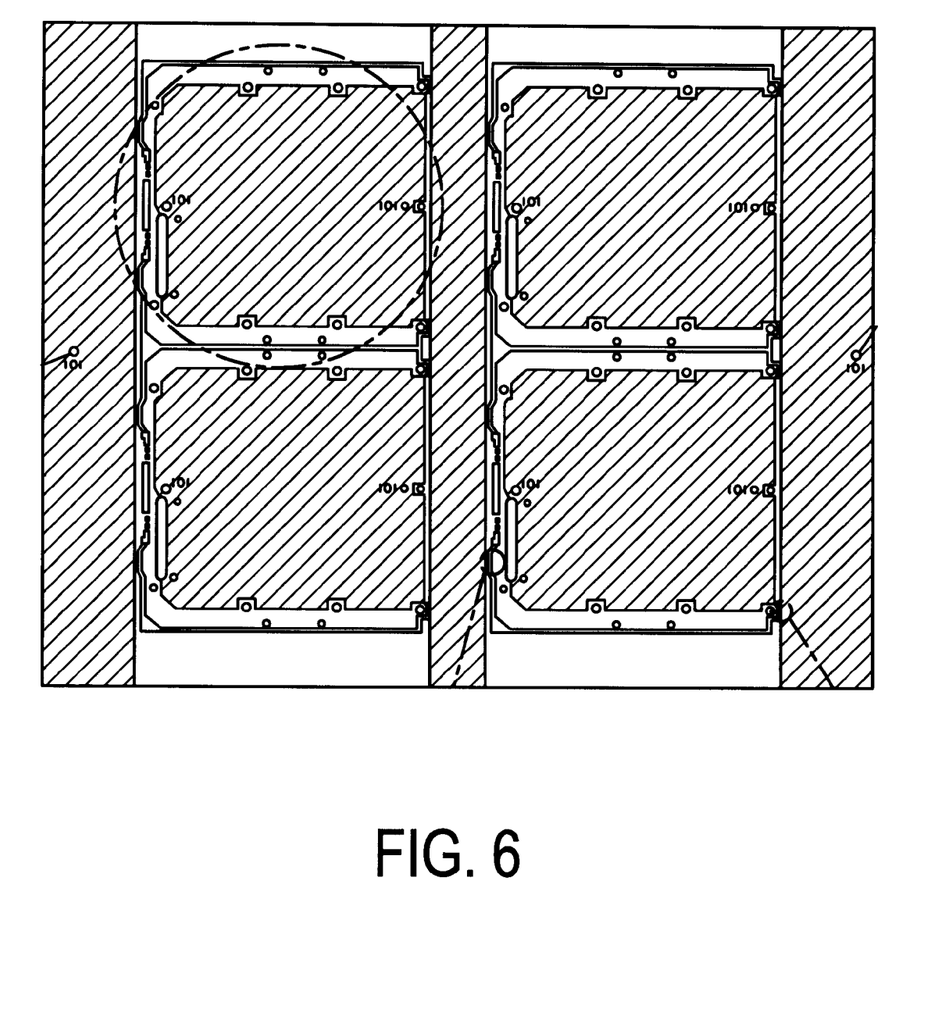
FIG. 6 shows plural electronic component assemblies in accordance with an exemplary embodiment of the present invention.

Multiple assemblies can also be formed as shown in FIG. 6. Printed wiring board patterns can be repeated any number of times on a laminate depending upon the size of the laminate. For example, the pattern disclosed in FIG. 6 is repeated 3 times. Four circuit card assemblies can be created while performing the steps for one assembly. Four heat sink assemblies are created and cut through the use of the router. As a result, the manufacture of the electronic component assemblies can be simplified due to the multiple images being formed.

It will be appreciated by those skilled in the art that the present invention can be embodied in other specific forms without departing from the spirit or essential characteristics thereof. The presently disclosed embodiments are therefore considered in all respects illustrative and not restricted. The scope of the invention is indicated by the appended claims rather than the foregoing description and all changes that come within the meaning and range and equivalence thereof are intended to be embraced within.

What is claimed is:

1. An electronic component assembly comprising:
   at least one electrical circuit having a first ground; and
   a heat sink assembly connected to said electrical circuit, said heat sink assembly further comprising;
   an inner core;
   a dielectric material that covers at least a portion of said inner core; and
   a conductive material having a second ground, formed on a conductive foil located on at least a portion of said dielectric material, said conductive material surrounding the periphery of said at least one electrical circuit for electromagnetically shielding said at least one electrical circuit.

2. The electronic component assembly of claim 1, wherein said inner core is made of an inner core material which is selected based on its electrical conductivity and thermal conductivity.

3. The electric component assembly of claim 2, wherein said inner core material is made of graphite composite.

4. The electronic component assembly of claim 1 wherein said dielectric material has a selected temperature value $T_g$ at which the dielectric material changes properties.

5. The electronic component assembly of claim 4, wherein said dielectric material is selected from the group consisting of:
   cyanate ester laminate, an epoxy based laminate, kevlar and polyamide quartz.

6. The electronic component assembly of claim 1, wherein said conductive material is nickel.

7. The electronic component assembly of claim 1, further comprising;
   a cover contacting said conductive material to form an electric shielding around said at least one electric circuit.

8. A heat sink assembly comprising:

a conductive inner core material at a first ground potential having a selected thermal conductivity and a selected electrical conductivity;

a first layer of a dielectric material placed at least in part on said conductive inner core and selected based upon a temperature at which said dielectric material changes physical properties;

a conductive material which contacts said inner core and extends from said inner core through a surface of said first layer; and a second conductive layer at a second ground potential selectively placed on said first layer.

9. The heat sink assembly of claim 8, further comprising;

a third conductive layer at said second ground potential placed on said second conductive layer.

10. A method for eliminating capacitive coupling between two electrical circuits comprising:

providing an inner core comprising a heat sink material, and a dielectric layer placed around said inner core;

selectively plating said dielectric layer with a first electrically conductive foil and plating a conductive material on the first electrically conductive foil;

placing first and second electrical circuits on the dielectric layer on opposite sides of said inner core;

making a hole in said inner core to extend from said first electrical circuit through the inner core and dielectric layer to the second electrical circuit; and plating said hole with a second electrically conductive foil to create a ground path among said inner core and said first and second electrical circuits.

11. The method of claim 10, further comprising:

placing a conductive cover, in contact with the electrically conductive material, over at least one of said first and second electrical circuits to provide an electrical shield, with said second ground potential, around said at least one circuit.

12. The method of claim 11, wherein said second electrically conductive material is nickel.

13. The method of claim 12, wherein said first electrically conductive material is copper.

14. The method of claim 10, wherein said inner core is made of an inner core material having selected electrical conductivity and thermal conductivity.

15. The method of claim 14, wherein said inner core material is made of graphite composite.

16. The method of claim 10, wherein said dielectric material has a selected electrical conductivity and a temperature value $T_g$ at which the dielectric material changes properties.

17. The method of claim 10, wherein said dielectric material is selected from the group consisting of:

cyanate ester laminate, epoxy based laminate, kevlar and polyamide quartz.

* * * * *